US006437864B1

(12) United States Patent
Watanabe et al.

(10) Patent No.: US 6,437,864 B1
(45) Date of Patent: Aug. 20, 2002

(54) STAGE POSITIONING DEVICE

(75) Inventors: Katsuhide Watanabe, Kanagawa; Ichiju Satoh, Tokyo; Takahide Haga; Yoshinori Jouno, both of Kanagawa, all of (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/355,034

(22) PCT Filed: Nov. 24, 1998

(86) PCT No.: PCT/JP98/05274

§ 371 (c)(1),
(2), (4) Date: May 18, 2000

(87) PCT Pub. No.: WO99/27540

PCT Pub. Date: Jun. 3, 1999

(30) Foreign Application Priority Data

Nov. 25, 1997 (JP) .............................................. 9-339329
Dec. 26, 1997 (JP) .............................................. 9-369519

(51) Int. Cl.[7] .......................... G01B 11/00; G03B 27/42
(52) U.S. Cl. .......................... 356/399; 356/400; 355/53
(58) Field of Search .................................. 356/399, 400; 355/53, 72, 75; 248/550

(56) References Cited

U.S. PATENT DOCUMENTS

| | | | |
|---|---|---|---|
| 5,157,296 A | | 10/1992 | Trumper |
| 5,187,519 A | * | 2/1993 | Takabayashi et al. ......... 355/53 |
| 5,294,854 A | | 3/1994 | Trumper |
| 5,610,686 A | * | 3/1997 | Osanai ......................... 355/72 |
| 5,693,990 A | * | 12/1997 | Miyazaki ..................... 310/15 |
| 5,812,420 A | * | 9/1998 | Takahashi .................... 364/508 |
| 6,038,013 A | * | 3/2000 | Ohsaki ......................... 355/53 |

FOREIGN PATENT DOCUMENTS

| | | |
|---|---|---|
| JP | 1-125932 | 5/1989 |
| JP | 4-54489 | 2/1992 |
| JP | 8-233964 | 9/1996 |

OTHER PUBLICATIONS

R. W. Arling et al., "Six Degree of Freedom Fine Motion Positioning Stage Based on Magnetic Levitation", $2^{nd}$ International Symposium on Magnetic Suspension TEchnology, pp. 641–652, Aug. 11–13, 1993.

D. A. Tichenor et al., "Recent results in the development of an integrated EUVL laboratory tool", SPIE Symp. on Electron–Beam, X–Ray, and Ion–Beam Submicrometer Lithographies, vol. 2437, pp. 292–307, 1995.

John B. Wronosky et al., "Development of a Wafer Positioning System for the Sandia Extreme Ultraviolet Lithography Tool", $3^{rd}$ International Symposium on Magnetic Suspension Technology, NASA Conference Publication 3336, Part 1, pp. 349–451, Dec. 13–15, 1995.

* cited by examiner

Primary Examiner—Frank G. Font
Assistant Examiner—Layla Lauchman
(74) Attorney, Agent, or Firm—Wenderoth, Lind & Ponack, L.L.P.

(57) ABSTRACT

A micro-positioning apparatus enables stable and rapid positioning of a stage on which a specimen is placed. The apparatus has a stage for placing a specimen to be radiated with a beam, actuators for levitating the stage and controlling a movement of the stage, a first position sensor for measuring a relative displacement between the stage and the actuators, a second position sensor for measuring a relative displacement between an actual radiation position of the beam on the specimen and a target radiation position, and a controller for positioning the stage so as to decrease the relative displacement detected by the second sensor.

16 Claims, 11 Drawing Sheets

F I G. 2
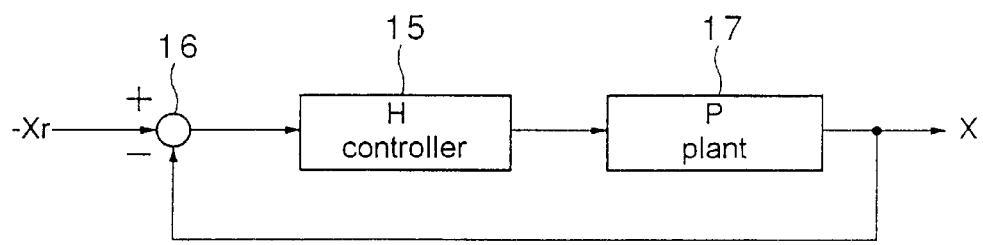
F I G. 3
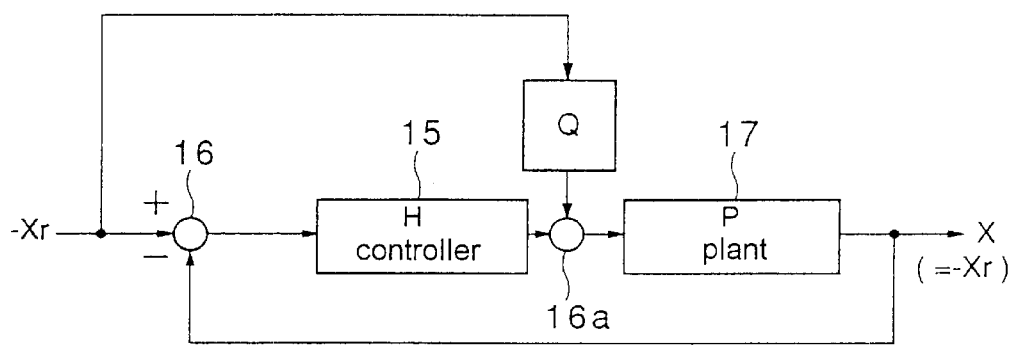

FIG. 14
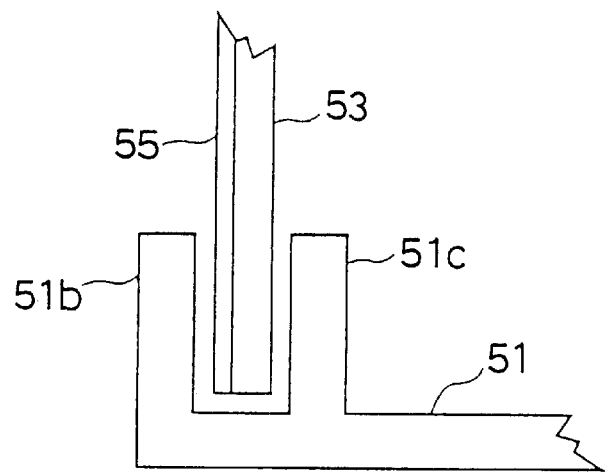
FIG. 15
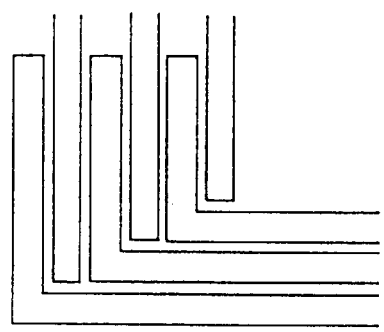
FIG. 16A
FIG. 16B
FIG. 16C
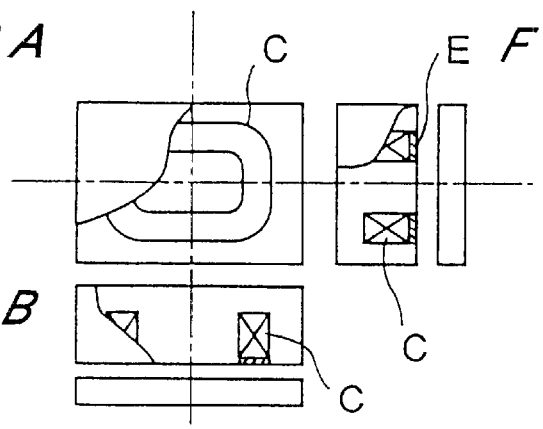

STAGE POSITIONING DEVICE

STAGE POSITIONING APPARATUS

1. Technical Field

This invention relates to a stage positioning apparatus, and relates in particular to a stage positioning apparatus suitable for placing a specimen in semiconductor device manufacturing and inspection apparatus.

2. Background Art

Various processing and observations in semiconductor manufacturing and inspection apparatuses are usually carried out by placing the specimen on an x-y stage.

In recent years, integrated circuit density has increased significantly, and consequently, line width and interline spacing of circuits has become smaller and micro-sized. Particularly, for sub-micron lithography, in order to secure high precision positioning in the layering of circuit patterns, it is essential to precisely position the patterns. High speed handling of the patterns is important for productivity.

However, conventional x-y stages are operated by feedback control of some actuators, for example, servo motors, provided on the x-y stage to move the stage by means of a ball screw and other arrangements. With such devices involving mechanical friction, positioning has not always been performed satisfactorily at high speed and high precision. Further, even for devices based on air bearings and linear motors to avoid mechanical friction effects, there is a problem that the positioning apparatus can be affected by acceleration and deceleration effects of a moving stage. The stage can be affected by excitation of fundamental frequencies, which adversely affects the accuracy of positioning.

For example, for a scan type stepper device, it is necessary to move the x-y stage smoothly at high speed and high precision. Thus, there has been an increasing demand for a high precision and high productivity x-y stage for positioning specimens for measuring or fabricating purposes in a semiconductor manufacturing apparatus. Similar needs exist for electron microscopy, such that positioning must be carried out at sub-micron accuracy precisely and quickly. Such precision positioning devices are sensitive to vibration, such that even though precision positioning has been originally performed, that position can be lost later due to vibration.

For this reason, vibration elimination devices are used to isolate or attenuate the vibrations that can be transmitted from an installation floor or external disturbances transmitted through air, such as air conditioning. However, vibrations that can be controlled by such vibration elimination devices are limited to those produced by the x-y table. For example, even if a semiconductor fabrication apparatus is placed on an anti-vibration table, it is not possible to control the vibration of an optical beam used to fabricate a specimen inside an apparatus for semiconductor manufacturing. For this reason, when positioning is required at sub-micron level precision in a specimen, the optical beam itself may be displaced by vibration such that the most important aspect in the fabrication, i.e., the beam position, cannot be precisely aligned.

DISCLOSURE OF INVENTION

This invention was made in light of the background described above, and it is an object of the present invention to provide a micro-positioning apparatus to enable stable and rapid positioning of a stage on which a specimen is placed. Also, another object is to provide a stage positioning apparatus that has a compact design and a low amount of leakage of magnetic flux and can be operated in a vacuum environment.

An apparatus for positioning a stage comprises a stage for placing a specimen to be radiated with a beam, actuators for levitating the stage and controlling a movement of the stage, a first position sensor for measuring a relative displacement between the stage and the actuators, a second position sensor for measuring a relative displacement between an actual radiation position of the beam on the specimen and a target radiation position, and a controller for positioning the stage so as to decrease the relative displacement detected by the second sensor.

According to this invention, the stage is directly positioned by measuring the relative displacement between the actual radiation position of the beam used for fabrication or measuring of the specimen and the target radiation position, and the stage is moved so as to decrease the relative displacement. By this process, the beam is accurately positioned on the target radiation position. This process enables micro-positioning of the beam to be carried out even when the beam itself or the stage itself is vibrating, for example, in a semiconductor production facility.

A magnetically levitated stage comprises a levitation body having a table section for placing a specimen and side plates extending from outer peripheries of the table section, and actuators for levitating and positioning the levitation body by controlling magnetic force generated by electromagnets therein, the actuators being surrounded by the table section and the side plates, wherein the actuators have permanent magnets disposed near a center section thereof for supporting the weight of the levitation body, electromagnets for controlling horizontal positioning which are disposed in four corners in an outer periphery thereof, and electromagnets for controlling vertical positioning which are disposed in a middle section between the electromagnets for horizontal positioning.

In accordance with the present invention, a compact stage positioning apparatus has been provided by disposing electromagnets and permanent magnets serving as actuators inside a boxed space having bottom opening of a levitation body.

BRIEF DESCRIPTION OF DRAWINGS

FIG. 2 is a block diagram of a control system for the apparatus.

FIG. 3 is another block diagram of the control system for the apparatus.

FIG. 14 is a diagram to explain a magnetic shield having a labyrinth structure.

FIG. 15 is another diagram to explain the magnetic shield having the labyrinth structure.

FIG. 16A is a plan view of an electromagnet, FIG. 16B is a cross sectional plan view of the electromagnet, and FIG. 16C is a cross sectional plan view of the electromagnet.

BEST MODE FOR CARRYING OUT THE INVENTION

Preferred embodiments of these inventions will be explained with reference to the drawings.

Figure 1A:
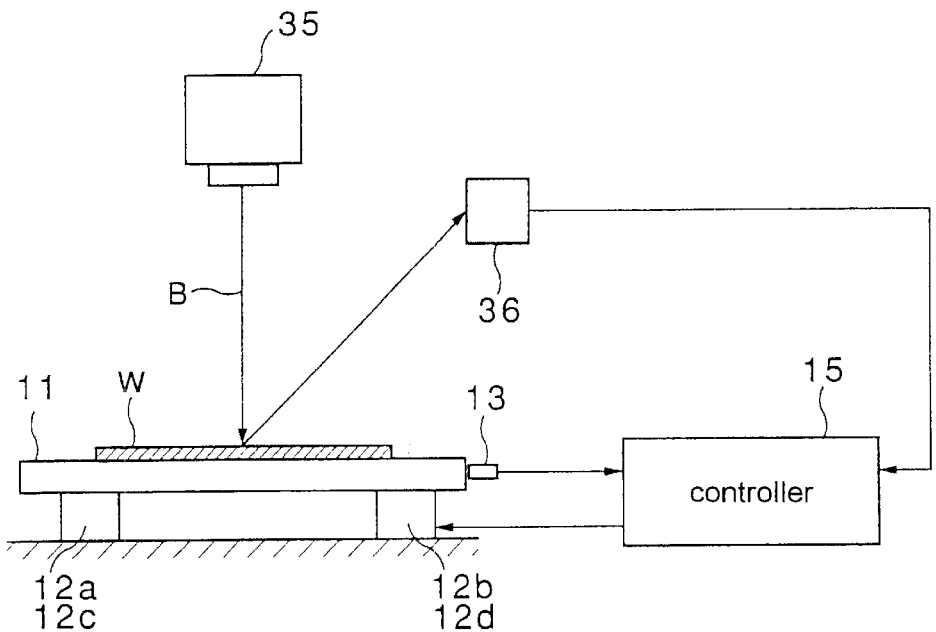
FIG. 1A is a schematic side view of a first embodiment of a stage positioning apparatus.
Figure 1B:
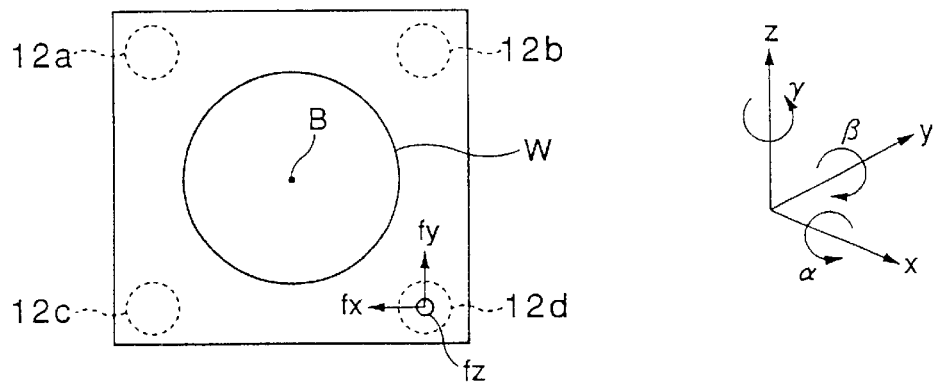
FIG. 1B is a plan view of the apparatus.
Figure 1C:
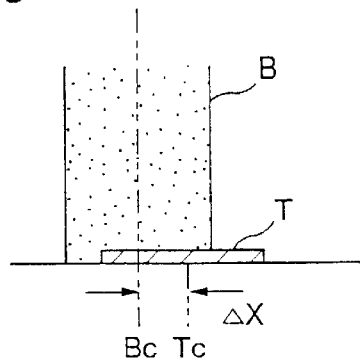
FIG. 1C is a partial enlarged view of the apparatus.

FIGS. 1A–1C show an embodiment of the stage positioning apparatus. In this apparatus, a stage 11 for placing a specimen is supported at four corners by actuators 12a, 12b, 12c and 12d. The actuators 12a, 12b, 12c, 12d are provided with six-degrees of freedom (x, y, z, $\alpha$, $\beta$, $\gamma$ directions) in the translational and rotational movements to generate actuator control forces fx, fy, fz, $f_\alpha$, $f_\beta$, $f_\gamma$. The stage 11 is for placing a specimen (wafer) for fabrication or measurement purposes using an electron beam or a light beam B. A displacement sensor (first sensor) 13 is provided for detecting the stage position and generating relative displacement signals to the actuators (stationary sections). Further, a controller 15 controls the actuator control forces fx, fy, fz, $f_\alpha$, $f_\beta$, $f_\gamma$, according to the relative position signals from the displacement sensor 13, actual radiation position and target radiation position sensors which will be described later.

Actuators 12a, 12b, 12c, 12d are made of electromagnets or a combination of permanent magnets and electromagnets. The pole surfaces of the actuators are oppositely disposed with surfaces of magnetic material or permanent magnets affixed on the stage. Therefore, by adjusting the coil current of the electromagnets, magnetic forces on the stage can be affected, so that the stage II can be levitated or moved or translated for positioning. Electromagnets are controlled in the levitating(vertical) and horizontal directions, and generate control forces in six-degrees of freedom in the x, y, z, $\alpha$, $\beta$, $\gamma$, directions. Any of the actuators 12a, 12b, 12c, 12d is capable of being controlled precisely at high speed by adjusting the current or voltage supplied to the actuators to generate the necessary forces.

A specimen W such as a wafer is placed on the stage 11. The specimen W is placed with a photo-resist for electron-beam exposure, for example, and micro-patterns are formed by radiating the coated specimen W with an electron beam B. The beam B is emitted from a beam source 35 and a pattern is formed by radiating the beam B on a target position of the wafer W. For positioning to the target position, the movement of the stage 11 is controlled by the actuators 12a, 12b, 12c, 12d. It is obvious that for making a line width of sub-micron precision, it is necessary to position the wafer W at less than sub-micron precision.

Therefore, the positioning is required to directly align the target radiation position with the actual radiation position. A sensor (second sensor) 36 is provided to measure the relative positions of the actual radiation position and the target radiation position. Measurement of relative positions is performed as illustrated in FIG. 1C. A target pattern T to show the target radiation position is provided on the wafer W, where the pattern T is made of a material that can reflect the electron beam B. When the beam B is maximally reflected with the pattern T, it shows that the center Bc of the beam B and the center Tc of the pattern T are coincided. When this matching occurs, the reflection is at a maximum, which is detected by the sensor 36 so that it is possible to determine that the target radiation position and the actual radiation position have been aligned. When the beam center Bc and the pattern center Tc are displaced, the reflected intensity decreases, and the amount of reflection is measured to determine the relative positions of the target radiation position and the actual beam radiation position.

Relative position signals of the actual radiation position of the beam B and the target radiation position, and the relative position signals with respect to the fixed side of the stage are input into the controller 15, and the stage 11 is moved by using the actuators 12 so as to decrease the relative displacement of the actual radiation position and the target radiation position. That is, the actuators 12 drive the stage 11 so as to directly position the target pattern T of the wafer W at the actual radiation position of the beam B.

FIGS. 2 and 3 show block diagrams of positioning control systems. The control system shown in FIG. 2 inputs a relative displacement Xr given by the actual radiation position and the target radiation position according to a sensor signal from the second sensor as the reference signal, and controls the controller 15 to operate the actuators so that the sensor signal X from the first sensor follows the sensor signal Xr from the second sensor. This is carried out by inputting the displacement signal Xr for the actual radiation position in the comparator 16, computing the difference between the actual displacement signal Xr and the stage position signal X, and generating compensation signals (operational signals) so as to decrease the difference to zero, which are supplied to the actuators 12a, 12b, 12c, 12d.

A plant 17 is used to show the relation between the input signal to the actuators and the resulting stage position signal X, and the stage position signal after the stage has been driven by the actuators is fed back to the comparator 16. Thus, the controller 15 treats the relative displacement of the stage and the actuator as the first control value, and treats the relative displacement of the actual radiation position and the target radiation position as the second control value, and the stage is controlled to move in reverse phase in relation with these control values. Therefore, when the relative displacement signal Xr of the beam radiation position is not input, the stage is always positioned in the reference position indicated by the relative displacement signal X relative to the fixed section of the stage. When the relative displacement signal Xr for the beam radiation position is input, actuators are moved according to the signal, and the stage is positioned so that the relative displacement is decreased by reducing the difference to zero between the actual radiation position and the target radiation position. Thus, the stage 11 is controlled to move so as to follow and align the target radiation position with the actual beam position.

The control system shown in FIG. 3 performs feedforward control to move the stage so that the actuators are operated to follow the position compensation signal by inputting the relative displacement signal Xr for the beam radiation position through a transmission function Q. In the control system shown in FIG. 3, the relative displacement signal Xr for the second sensor, that is, the actual radiation position of the beam B and the target radiation position, is used as reference signal, and is input in the comparator 16, and the relative displacement signal X for the first sensor will follow the signal Xr through the controller 15, and such actions are the same as the control system shown in FIG. 2. The relative displacement signal Xr for the beam position is input in the comparator 16, and the difference from the stage position signal X is computed, and the compensation signals (operational signals) are generated, so as to make the difference zero, and are supplied to the actuators 12a, 12b, 12c, 12d.

In this control system, the relative displacement signal Xr between the actual radiation position of the beam B and the target radiation position is added to the output signal from the controller 15 through the transmission function Q. The transmission function Q is given, for example, by the following relation.

$$Q=-(1+PH)/P$$

where P is a transmission function of the plant 17, and H is a transmission function of the controller 15. Such a feedforward control system enables the expansion of the controllable frequency bandwidth significantly to increase the stability thereof.

Figure 4:
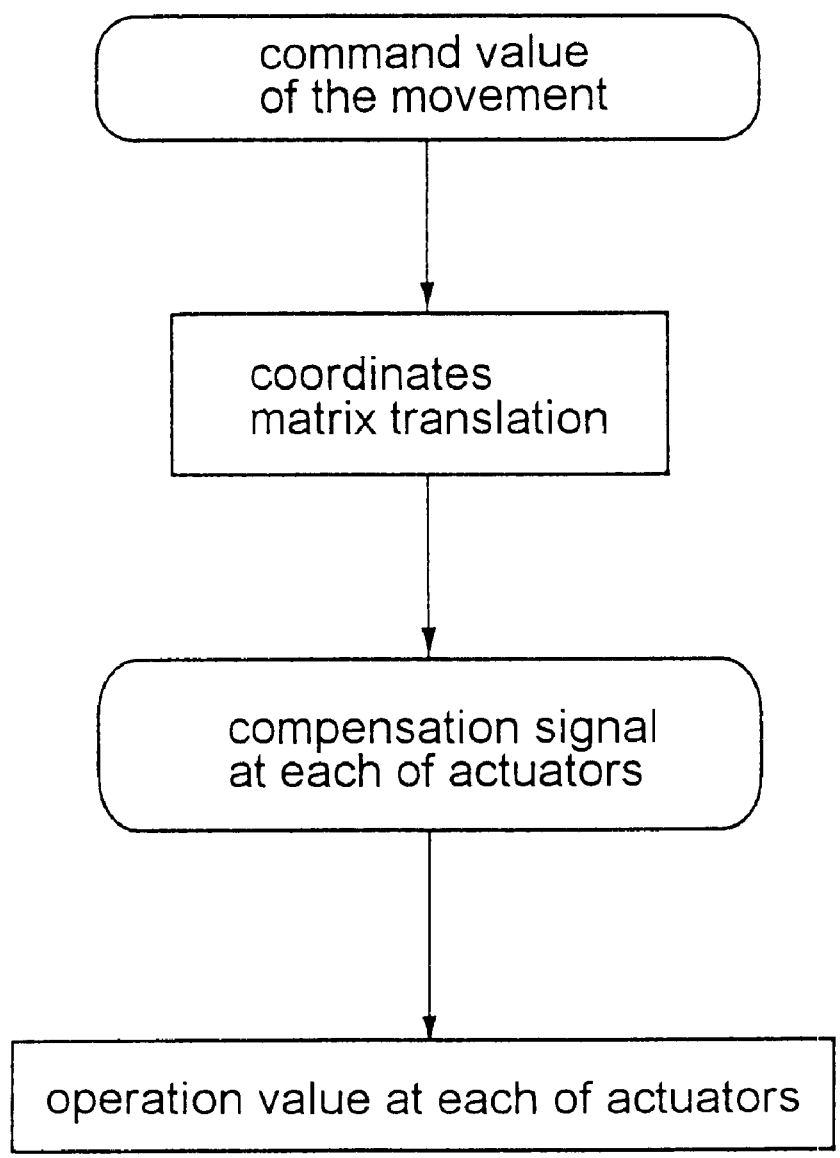
FIG. 4 is a flowchart of the control system for the apparatus.

FIG. 4 shows a flowchart for converting a moving position compensation signal based on the relative displacement signal between the actual radiation position and the target radiation position to the compensation signal for each actuator position. A command value of the movement of the stage on the plane is given by coordinates X, Y. However, the actuators 12a, 12b, 12c, 12d for moving the stage to the commanded position are provided on the four corner sections of the stage. Therefore, the compensation signal at each of the actuators 12a, 12b, 12c, 12d is required to be converted from the command signal value of the movement. For this reason, a coordinate conversion array is used to convert the command values of the coordinates to the position compensation signals for each actuator.

Therefore, the controller H has a computation section to convert the relative displacement between the actual radiation position and the target radiation position to the relative displacement of the center of gravity of the stage in the coordinates, a computation section to generate the operational values corresponding to the displacement of the gravity positions converted to the coordinates, and a computation section to distribute the operational values at each of the acting points of the electromagnets.

The stage 11 may be provided with a sensor for detecting vibrations. An acceleration value of the specimen W obtained from the sensor may be input in the controller H, which controls so as to decrease the vibration. Thus, when the stage itself is vibrating, stage vibration can be attenuated so as to improve positioning of the actual radiation position and the target radiation position even more reliably. In this case, the controller H has a computation section to convert the acceleration in the coordinates to the position of the center of gravity of the stage 11, and a computation section to generate the operational values based on the acceleration of the converted coordinates, and a computation section to distribute the operational values at the acting points of the electromagnets.

Figure 5:
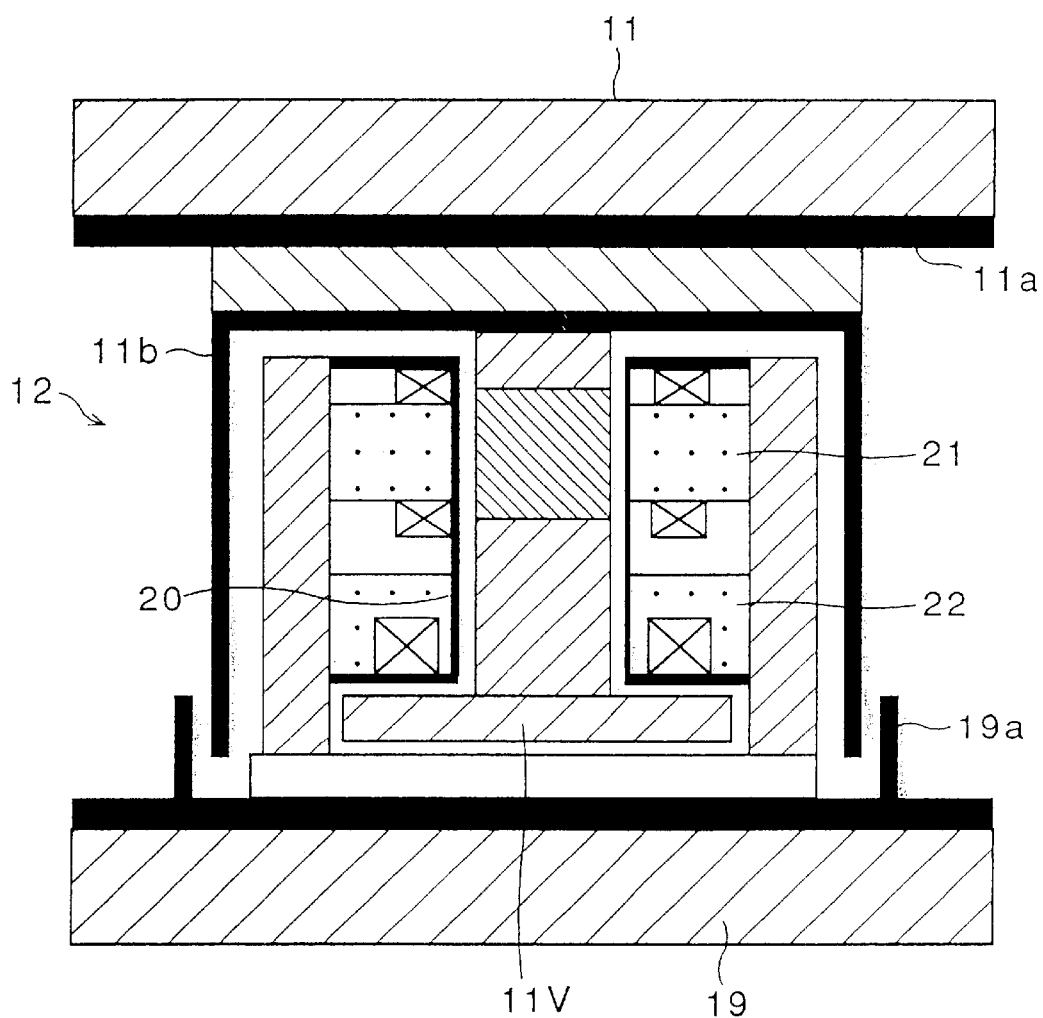
FIG. 5 is a cross sectional side view of an embodiment of the stage positioning apparatus.

FIG. 5 shows an embodiment of the electromagnetic actuator section of the positioning apparatus. The stage 11 with a specimen W is supported at its four corners by the electromagnetic actuators 12 having electromagnets 21, 22. Electromagnet 21 performs positioning in the horizontal direction by attracting a magnetic body fixed on the stage 11 by magnetic attractive force which is controlled by the current supplied from the controller. Electromagnet 22 similarly supports the stage 11 non-contactingly by attracting a magnetic body 11v fixed on the stage 11 by magnetic attractive force. Vibrations from the floor are prevented from reaching the stage levitated by the actuators. The floating support may be produced by using permanent magnets in addition to the electromagnets. This arrangement reduces the current load of the electromagnets.

As shown in FIG. 5, when the actuators use electromagnets, leaking magnetic flux generated by the actuators are prevented from affecting the stage by a magnetic coating and by a plate 11a on the bottom surface of the stage 11. Further, a cover 11b of magnetic material having a labyrinth structure is provided in such a way to surround the actuators 12 to prevent flux leakage from the actuator. To prevent leaking magnetic flux from the space in the labyrinth structure, a magnetic coating or plate 19a is provided on the fixed surface 19 which attaches to the actuators 12. Further, the electromagnets are protected by a can 20 so as to enable the stage positioning apparatus to be used in a vacuum without the problem of degassing. Also, the entire actuators may be covered by a can.

Figure 6:
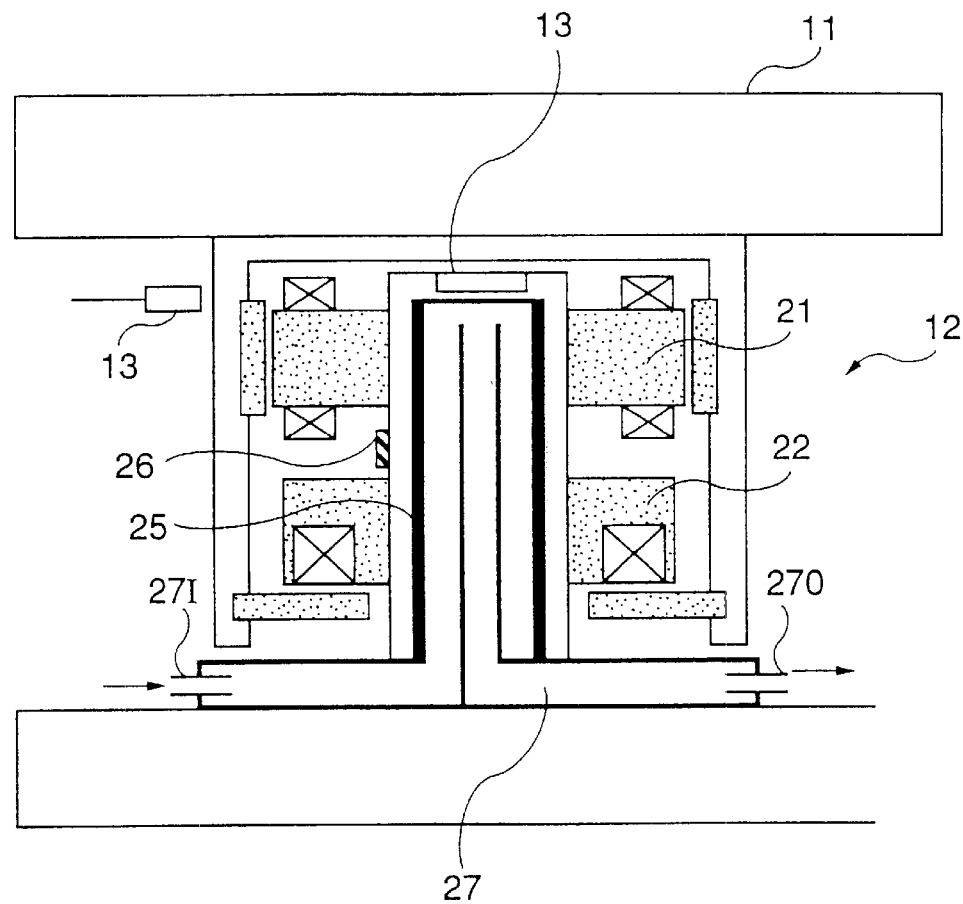
FIG. 6 is a diagram of a variation of the apparatus shown in FIG. 5.

FIG. 6 shows an example of using a cooling system on the actuators. When precision positioning is required, there is a problem of thermal dissipation produced by the electromagnets. Heat from the electromagnets deforms various parts of the actuators to cause a problem of preventing the attainment of the precision required. A system of cooling based on a quick acting Peltier element may be considered. The actuators shown in the drawing are outer type actuators, so that the center part is the fixed part, and outer parts are provided with a levitation body. Heat is generated mainly from the fixed side of electromagnets so that Peltier elements (cylindrical) 25 are bonded to the inside of the parts (cylindrical) and water is flowed through an inside passage 27. In this case, the outside of the Peltier element is the heat absorption side, the inside is the heat generation side. By using this cooling system, cooling water flowing from an inlet port 271 absorbs the heat transferred by the Pettier element 25, and is discharged outside from an outlet port 270 to maintain the temperature of the actuators at normal temperatures.

Figure 7:
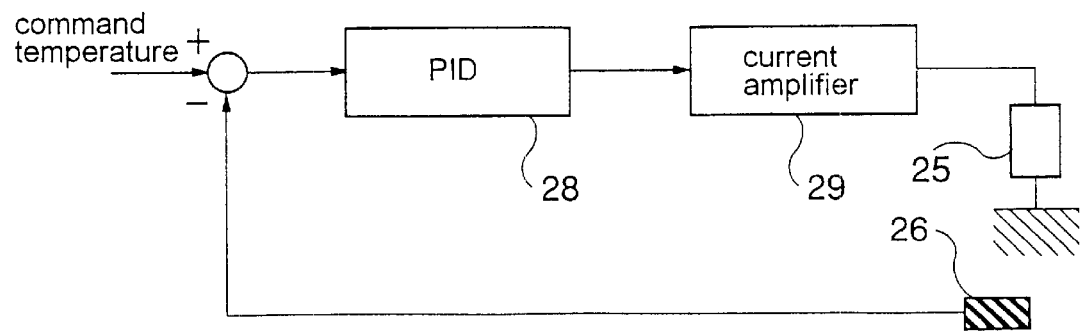
FIG. 7 is a block diagram of a cooling system control for the apparatus shown in FIG. 6.

Also, to keep the temperature constant, the temperature of the fixed parts of the electromagnets are detected by a temperature sensor 26 and the current through the Peltier element 25 is controlled to maintain the cooling system in a stable condition. FIG. 7 shows such a temperature control system, and the temperature detected by the temperature sensor 26 is compared with a temperature command, and a temperature controller 28 is operated in PID so as to make the difference zero. The output of the temperature controller 28 is amplified in an electrical amplifier 29 and is supplied to the Peltier element 25, thereby controlling the heat transfer from the heat absorption side to the heat generation side. Thus, the temperatures of the various parts of the actuators are kept within a constant range.

Figure 8:
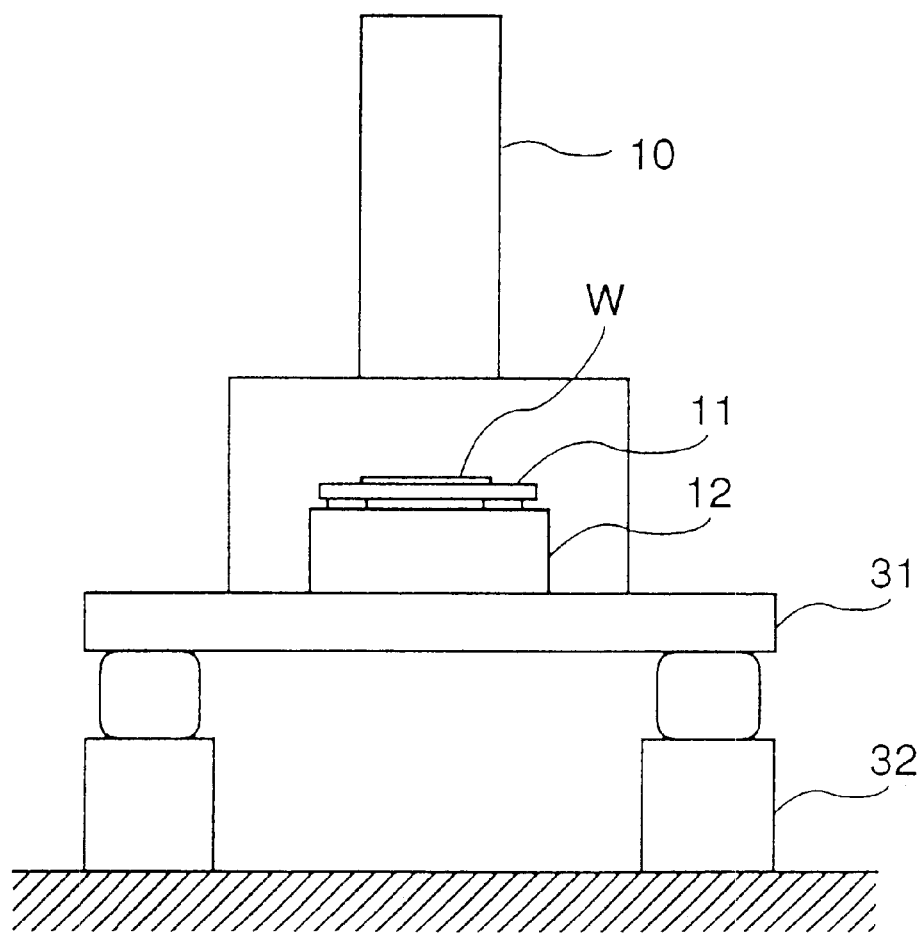
FIG. 8 is a diagram for explaining the stage positioning apparatus disposed on a high performance vibration elimination device.

FIG. 8 shows an example of installing the stage positioning system on an vibration elimination device. A beam source 10, an electron-beam generator, for example, is placed on a table 31 of a high performance active vibration elimination device 32. The stage 11 having a specimen W to be fabricated by the electron beam from the beam source 10 and the actuators 12a, 12b, 12c, 12d supporting the stage are also placed on the table 31. This configuration essentially eliminates the transmission of vibrations from external regions to stage 11, actuators 1 2a, 1 2b, 1 2c, 12d, beam source 10, and enables even higher precision positioning. This arrangement also prevents generation of vibration caused by the movement of the positioning apparatus including the stage 11. The vibration elimination device is most suitably produced by a non-contact magnetic floating arrangement using the electromagnetic actuators, and a combination device of air springs and electromagnetic actuators.

Also, stage positioning for actual radiation position and the target radiation position is used mainly for position compensation in production of micro-patterns using the electron beam. For example, for moving the stage at a large distance for producing another pattern, the controller H is controlled in PID mode according to feedback of the output signal from the first sensor for measuring the relative displacements of the actuators and the stage. In this case, the relative displacement signal Xr for the actual radiation position of the beam B and the target radiation position are stopped, and the input to the comparator 16, for example, would be zero.

The second sensor for detecting the relative displacement for the' actual radiation position of the beam B' and the target radiation position may use the beam B for performing actual fabrication, or another beam B' which is in parallel. In this case, the relative position is obtained by radiating the specimen with the beam B and radiating the target pattern T with the parallel beam B'. When using the beam B for fabrication and relative displacement measurements, time-sharing may be used to detect the two quantities.

As explained above, this invention enables the controlling of positioning precisely by directly acting on the actual radiation position of the beam and the target radiation position on the specimen. Therefore, the positioning apparatus is most suitable for a specimen pedestal for producing micro-patterns using a beam of the order of sub-microns.

Figure 9:
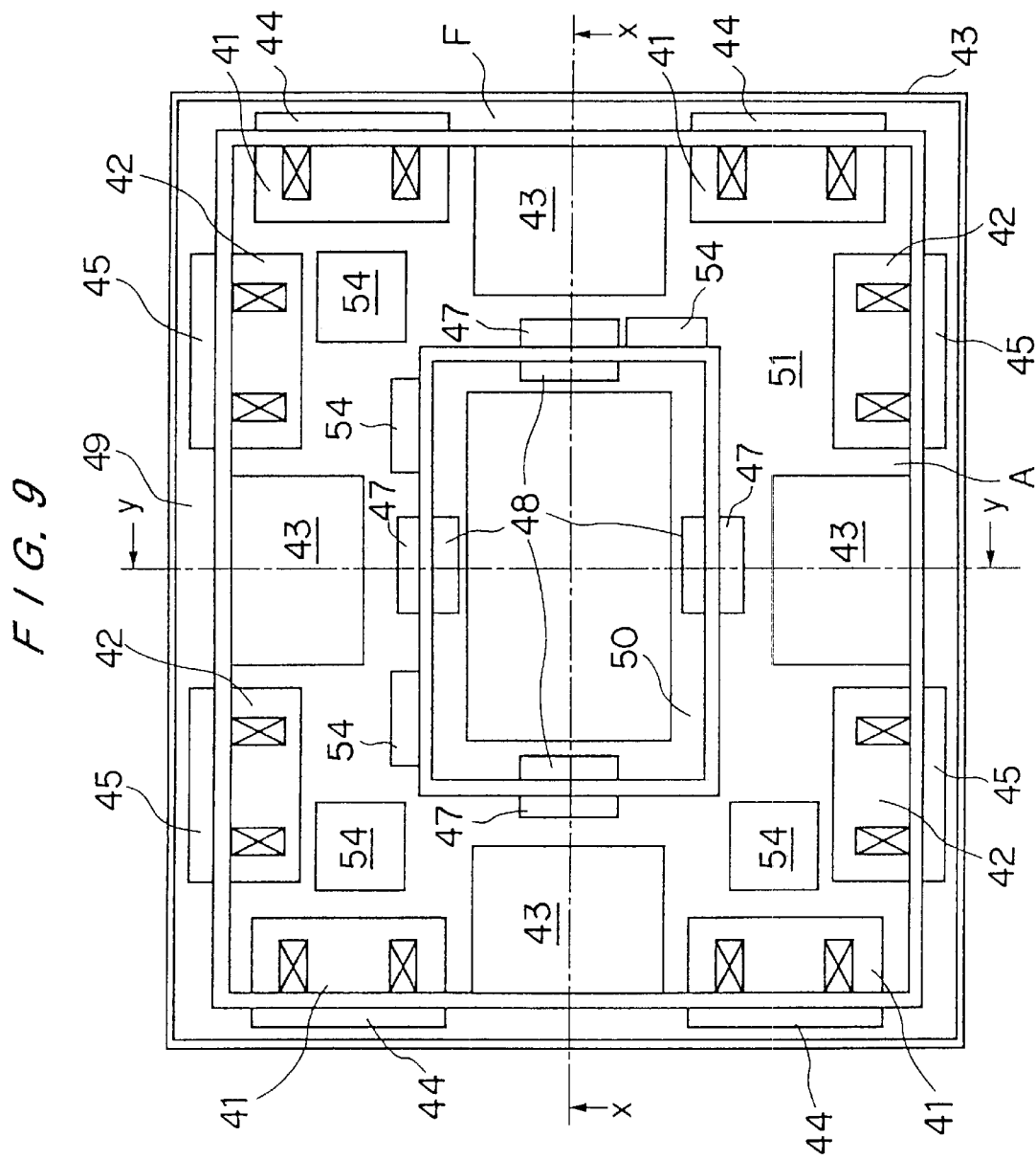
FIG. 9 is a diagram to show an arrangement of another embodiment of the stage positioning apparatus.
Figure 10:
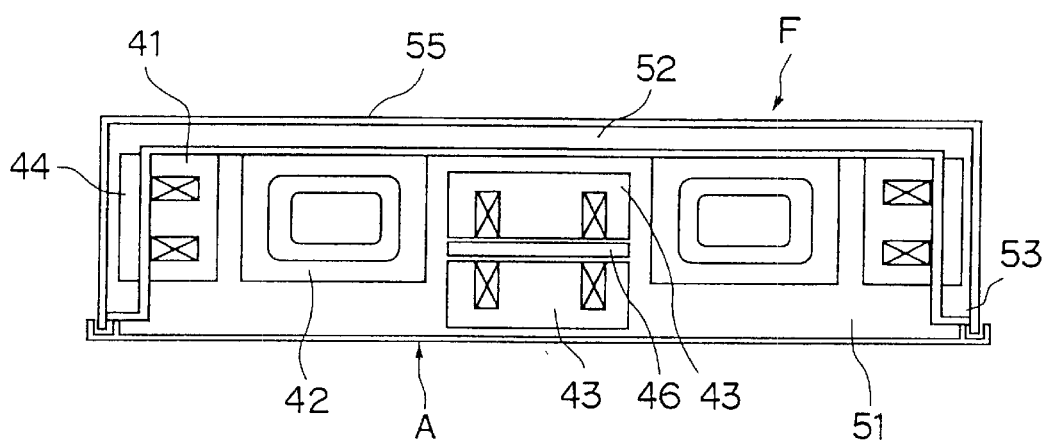
FIG. 10 is a through side view of the apparatus shown in FIG. 9.
Figure 11:
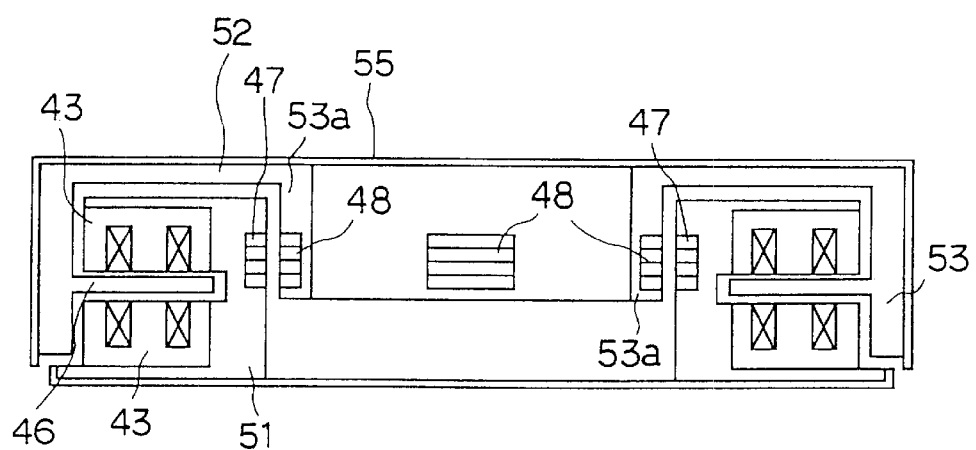
FIG. 11 is a cross sectional side view of the apparatus shown in FIG. 9.

FIGS. 9 through 11 show another embodiment of the stage positioning apparatus. A levitation body F has a plate 52 for a center table to place a specimen and four vertical plates 53 extending from the outskirts of the plate 52, and the bottom of the plate 52 is open to form a box type plate. Actuators A, as a fixed part, are placed inside the box type table. The actuators comprise a permanent magnet 47 comprising one side of a passive magnetic bearing for supporting the levitation body F inside the space surrounded by the boxed plate 52 and the side plates 53, electromagnets 41, 42 to move the levitation body F in the horizontal direction, an electromagnet 43 for moving the levitation body F in the vertical direction, and a sensor 54 for detecting the relative displacement between the pole surfaces of the electromagnet and the target fixed to the levitation body F.

On the inside surface of the box type side plate 53 having a bottom opening is provided with a target 44 for responding to the magnetic force in a horizontal direction by the electromagnet 41 for the x-direction, and a target 45 for responding to the magnetic force in the horizontal direction by the electromagnet 42 for the y-direction. A target plate 46 for responding to the magnetic force in a vertical direction by the electromagnet 43 for the z-direction is fixed to the inside o f the side plate 53.

The actuators A have magnetic bearings 47, 48 placed centrally inside a space formed by the plate 52 serving as the table and side plates 53 at outskirts of the plate 52 constituting the levitation body F, for supporting the weight of the table, the electromagnets 41, 42 on the outer four corners in the space, for moving the levitation body F in the x- and y-directions, and electromagnets 43 for moving the levitation body F in the vertical direction, the z-direction, in the middle between the electromagnets 41, 42 for moving in the x- and y-directions. This arrangement includes all the parts, including the coils, of the eledromagnets installed in the space formed by the plate 52 and the side plates 53 as floating body F.

By placing the electromagnets 41, 42 on the four corners of the box type table, controls for the x-, y- and rotation about the z-direction can be easily carried out. By placing the electromagnet 43 for controlling positioning in the vertical direction between the electromagnets 41, 42, the z-direction movement, rotational control about the x- and y-directions can be easily carried out. Such controls can be carried out at high precision using a static capacitor sensor and others for position control sensors, and comparing the output signal with a target value to feedback the signal to control the excitation current for the coil of the electromagnets. This type of control can accomplish six-axes control at a precision of the order of nanometers.

The electromagnet 43 for vertical direction control, as shown in FIG. 11, comprises a pair of electromagnets, which are disposed in such a way that each pole surface in the vertical direction is opposed to the other, and a magnetic body 46, fixed to the levitation body F, is inserted between the pole surfaces of electromagnets in the horizontal direction. But, this vertical direction electromagnet may be disposed in such a way that each has a pole surface on the top and bottom surface, so that both pole surfaces are facing in the opposing vertical direction, and the pole surfaces of the electromagnets are facing the magnetic body fixed in the horizontal direction to the top and bottom side of the side plates of the outer surfaces of the levitation body. Actuators A have magnetic bearings 47, 48 supporting the weight of the table F in about the center of the space formed by the flat plate and side plates of the box type table. As shown in the cross sectional view in FIG. 11, the flat plate 52 has a vertical second side plate 53a in about the center of the table. A pair of permanent magnet arrays 47, 48 is disposed between one surface of the side wall 53a and one side of the fixed side 51 to serve as passive electromagnets. In this embodiment, the side plate 53a of a rectangular cross sectional shape has the permanent magnet array 48 at four outskirts, and the surface stage opposing fixed side 51 also has the four permanent magnets array 47. As shown in FIG. 12, the permanent magnet arrays 47, 48 are arranged in several layers so that the magnetizing direction of the N, S poles are facing opposite to each other.

Figure 12A:
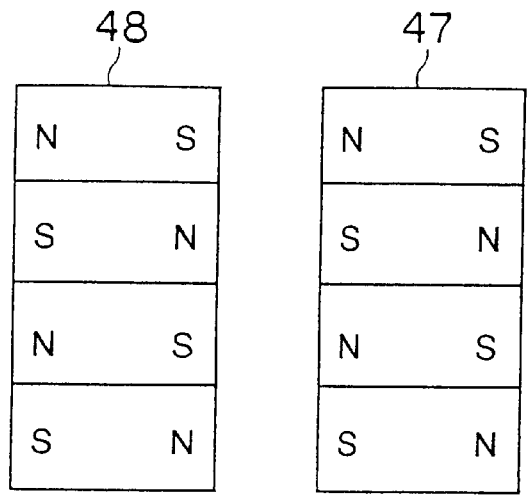
FIGS. 12A–12C are diagrams to explain passive magnetic bearings based on permanent magnets, which are employed in the apparatus shown in FIG. 9.
Figure 12B:
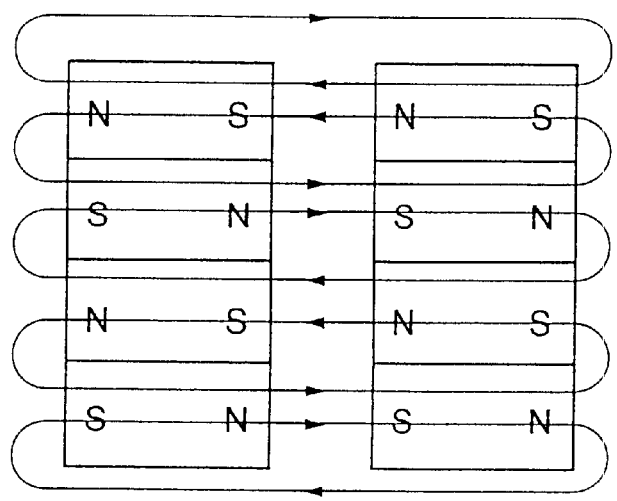
Figure 12C:
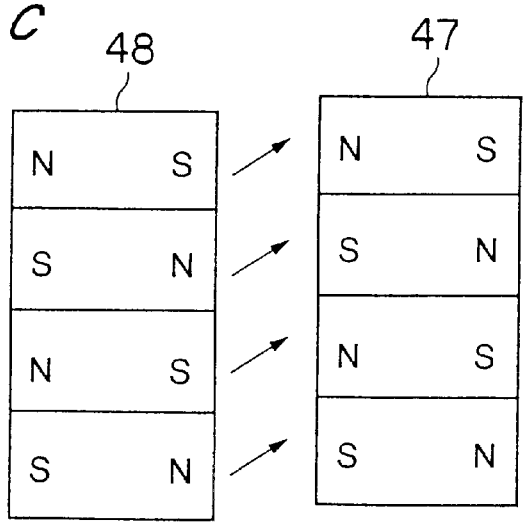

By arranging the permanent magnetic arrays 47, 48, as shown in FIG. 12A, in opposing directions, and one side is fixed to the fixed side of the actuators A, and the other side is fixed to the side surface of the side plate 53a on the inside surface of the levitation body F so that each faces the other. Then, as shown in FIG. 12B, the magnetic flux lines pass through and between the magnetic plates of opposite polarities of the respective permanent magnets on the floating side and the fixed side. Therefore, as shown in FIG. 12C, the floating side permanent magnet arrays fixed to the table generate vertical restoring force F against the fixed side permanent magnets by the weight at the location positioned downward, and balance is obtained to support the weight of the levitation body F.

Although the passive type electromagnetic bearings based on permanent magnets are disposed at four locations between the side plates disposed on the inside surface of the table and the fixed side, it is desirable that the center location in the vertical direction is coincident with the center of gravity of the table. This arrangement enables the flat plate 52 with the specimen to be levitated horizontally by the levitation body F in a more stable manner.

Figure 13:
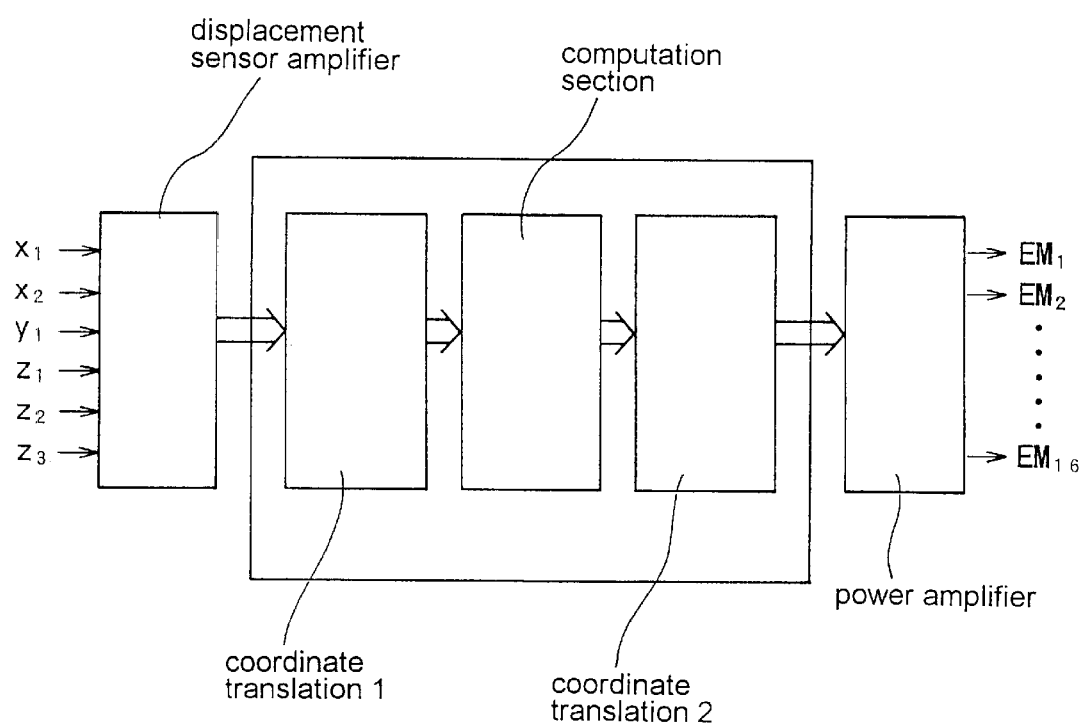
FIG. 13 is a block diagram of a control system for the apparatus shown in FIG. 9.

A control system for the stage positioning apparatus is shown in FIG. 13. A displacement sensor 53 for detecting displacement of the stage comprises a total of six sensors, with three sensors for detecting horizontal displacement of the stage and three sensors for detecting vertical displacement of the stage. Output signals from the six sensors are detected through sensor amplifiers, and converted to displacement values or values corresponding to displacements by passing them through a coordinate conversion device 1. Converted signals are processed by a computation section such as PID or vibrational mode computers, to obtain control values, which are converted to command values for each electromagnet in the coordinate conversion device 2, and coil currents corresponding to each of the command values are obtained through power amplifiers to operate each electromagnet so as to position the stage. The controller may be a digital or analog type.

A shield material 55, such as Permalloy, is bonded to the levitation body F and on the outer surface of the fixed section 51 of the actuators A so as to prevent leaking of magnetic flux from the electromagnet and permanent magnets. However, the space between the table and the fixed sections cannot be fixed with the shield material, and to prevent leaking from this space, it is preferable to adopt the structure shown in FIG. 14. The outer surface of the fixed side comprises side plates 51b, 51c made of a double walled magnetic material, and the bottom section of the side plates 53 extending from the four peripheries of the table section (flat plate 52) are inserted in the space between the double-walled side plates 51b, 51c.

This arrangement produces a shield with a labyrinth structure, and leaking of magnetic flux from the electromagnets and permanent magnets can be prevented. Also, the labyrinth structure of the shield may be made from a triple-walled structure, as shown in FIG. 15.

Also, in this embodiment, the horizontal direction control electromagnets 41, 42 and the vertical direction control electromagnet 43 have the same size and shape. Therefore, standardized components can be adopted so as to provide the stage positioning apparatus economically. Also, as shown in FIGS. 16A–16C, each coil C of the electromagnets is housed inside the pole core section, and the entry points are sealed by molding with resins E, such as epoxy resin. For this reason, the coils are not exposed so that even when they are exposed to a vacuum environment, degassing does not occur, thus enabling the maintenance of high cleanliness.

Also, although the above embodiments are illustrated in terms of the six-degrees of freedom, the vertical direction control electromagnet 43 may be eliminated or have planar controls only. Variations are possible without departing from the basic principle of the present invention disclosed herein.

As explained above, according to this invention, a compact stage positioning apparatus has been provided by disposing electromagnets and permanent magnets serving as actuators inside a boxed space having bottom opening of a levitation body. Also, leaking magnetic fluxes are minimized so that adverse electromagnetic effects are not experienced by the neighboring components. Also, because the electromagnetic coils are not exposed externally, so that there is no problem of degassing, and enabling the apparatus to be used in a vacuum or clean environment.

INDUSTRIAL APPLICABILITY

This invention is useful for high-speed and precise micro-positioning of objects in advanced processes, such as semiconductor processing.

What is claimed is:

1. A stage positioning apparatus comprising:

a stage for placing a specimen to be radiated with a beam thereon;

a plurality of actuators operable to levitate said stage and to control a movement of said stage;

a first position sensor operable to measure a relative displacement between said stage and said plurality of actuators;

a second position sensor operable to measure a relative displacement between an actual radiation position of the beam on the specimen and a target radiation position; and a controller operable to position said stage so as to decrease the relative displacement detected by said second position sensor, wherein said controller controls a first control value comprising the relative displacement between said stage and said plurality of actuators such that the first control value follows a command position, and a second control value comprising the relative displacement between the actual radiation position and the target radiation position of the beam such that said stage moves to decrease the second control value.

2. A stage positioning apparatus according to claim 1, further comprising a plurality of one of magnetic materials and permanent magnets attached to said stage, wherein said plurality of actuators comprising one of electromagnets and a combination of electromagnets and permanent magnets, said plurality of actuators levitating and controlling the movement of said stage by applying magnetic force, generated by said one of said electromagnets and said combination of electromagnets and permanent magnets, on said plurality of one of said magnetic materials and said permanent magnets.

3. A stage positioning apparatus according to claim 1, wherein said controller has a computation section operable to convert the relative displacement between the actual radiation position and the target radiation position to coordinates of a relative displacement of a center of gravity of said stage, a computation section operable to generate operational values coresponding to the displacement of the center of gravity of said stage, and a computation section operable to distribute the operational values to acting points of said plurality of actuators.

4. A stage positioning apparatus according to claim 1, wherein said stage is provided with a sensor operable to detect acceleration values of vibrations, and the detected acceleration values are input into said controller to control the movement of said stage to decrease the vibrations.

5. A stage positioning apparatus according to claim 4, wherein said controller has a computation section operable to convert the acceleration values to coordinates of a center of gravity of said stage, a computation section operable to generate operational values corresponding to an acceleration of the center of gravity of said stage, and a computation section operable to distribute the operational values to acting points of said plurality of actuators.

6. A stage positioning apparatus according to claim 1, wherein the beam is selected from a group consisting of an electron beam and a light beam.

7. A stage positioning apparatus according to claim 1, further comprising a vibration elimination device, wherein said plurality of actuators are located on said vibration location device to decrease vibrations of fixed sections of said plurality of actuators.

8. A stage positioning apparatus according to claim 1, wherein one of said stage and said plurality of actuators is coated with a magnetic material to shield magnetic fluxes generated by said plurality of actuators from affecting outsides thereof.

9. A stage positioning apparatus according to claim 1, wherein said stage is provided with a shield having a labyrinth structure made of a magnetic material to shield magnetic fluxes generated by said plurality of actuators from affecting outsides thereof.

10. A stage positioning apparatus according to claim 1, wherein each of said plurality of actuators comprises a Peltier element fixed to an electromagnet, said Peltier element having a flow passage for cooling water provided in a heat generation side of said Peltier element to absorb heat generated by said electromagnet.

11. A stage positioning apparatus comprising:
   a levitation body having a table section for placing a specimen thereon and a plurality of side plates extending vertically from outer peripheries of said table section;
   a plurality of actuators having a plurality of electromagnets, said plurality of actuators being operable to levitate and position said levitation body by controlling magnetic forces generated by said electromagnets, said plurality of actuators being covered with said table section and said plurality of side plates of said levitation body,
   wherein said plurality of actuators levitate and control movement of said levitation body by applying magnetic force.

12. A stage positioning apparatus according to claim 11, further comprising a plurality of one of magnetic materials and permanent magnets attached to said levitation body, wherein one of said plurality of electromagnets and said plurality of electromagnets and permanent magnets generate the magnetic force which acts on said plurality of one of magnetic materials and permanent magnets.

13. A stage positioning apparatus according to claim 11, further comprising a plurality of inner side plates firmly attached to said levitation body to surround a central section of a bottom surface of said table section, said plurality of inner side plates and said plurality of actuators each being respectively provided with a plurality of permanent magnets having opposing magnetic pole surfaces to levitate said levitation body as a plurality of magnetic bearings.

14. A stage positioning apparatus according to claim 13, wherein each of said pluralities of permanent magnets are arranged vertically as a pair of magnet arrays having opposing magnetic pole surfaces disposed such that magnetizing directions of north and south poles are opposing each other, first magnetic arrays of said pairs of magnetic arrays being fixed to each of said plurality of actuators and second magnetic arrays of said pairs of magnetic arrays being fixed to each of said plurality of inner side plates of said levitation body.

15. A stage positioning apparatus according to claim 11, wherein said plurality of electromagnets comprise coils disposed within magnetic pole core sections, said coils being sealed in a resin.

16. A stage positioning apparatus comprising:
   a levitation body having a table section for placing a specimen thereon and a plurality of side plates extending vertically from outer peripheries of said table section;
   a plurality of actuators each having a plurality of permanent magnets disposed near a center section thereof to support a weight of said levitation body, a plurality of electromagnets disposed in four corners in outer peripheries of said plurality of actuators to control horizontal positioning, and an additional plurality of electromagnets disposed in a middle section between said plurality of electromagnets disposed in said four corners to control vertical positioning, said plurality of actuators being operable to levitate and position said levitation body by controlling magnetic forces generated by said pluralities of electromagnets, said plurality of actuators being surrounded by said table section and said plurality of side plates of said levitation body.

* * * * *